(12) United States Patent
Okuno et al.

(10) Patent No.: US 7,446,015 B2
(45) Date of Patent: Nov. 4, 2008

(54) SEMICONDUCTOR DEVICE AND METHOD FOR MANUFACTURING THE SAME

(75) Inventors: Yasutoshi Okuno, Kyoto (JP); Masaru Yamada, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 384 days.

(21) Appl. No.: 11/006,665

(22) Filed: Dec. 8, 2004

(65) Prior Publication Data

US 2005/0285217 A1    Dec. 29, 2005

(30) Foreign Application Priority Data

Jun. 23, 2004  (JP)  ............... 2004-184495

(51) Int. Cl.
*H01L 21/76* (2006.01)

(52) U.S. Cl. .................................... 438/400

(58) Field of Classification Search ............. 257/758, 257/499; 438/400; 327/563
See application file for complete search history.

(56) References Cited

U.S. PATENT DOCUMENTS 6,809,582 B2 * 10/2004 Morimoto et al. ........... 327/563
6,992,392 B2 *  1/2006 Mori ......................... 257/758

FOREIGN PATENT DOCUMENTS

JP      9-107028       4/1997
JP      2003-188280 A  7/2003

* cited by examiner

Primary Examiner—Davienne Monbleau
Assistant Examiner—Monica D Harrison
(74) Attorney, Agent, or Firm—McDermott Will & Emery LLP

(57) ABSTRACT

A semiconductor device includes a circuit formation region which is formed in a semiconductor substrate and includes a plurality of element formation regions surrounded by isolation regions, respectively. A stress effect relief region of a predetermined width is formed around the circuit formation region to relieve a stress effect of the isolation regions on the operation characteristics of elements formed in the element formation regions and a plurality of dummy features are formed in the stress effect relief region and other part of the circuit formation region than the element formation regions at predetermined distances, the dummy features having the same composition as the element formation regions and predetermined planar dimensions. The predetermined planar dimensions of the dummy features are defined by longitudinal and transverse dimensions most frequently found in the plurality of element formation regions formed in the circuit formation region or selected dimensions of the element formation regions. The predetermined distances between the dummy features are specified as the minimum allowable value in respect of the manufacture of the elements.

4 Claims, 11 Drawing Sheets

SEMICONDUCTOR DEVICE AND METHOD FOR MANUFACTURING THE SAME

CROSS-REFERENCE TO RELATED APPLICATIONS

This non-provisional application claims priority under 35 U.S.C. §119(a) on Patent Application No. 2004-184495 filed in Japan on Jun. 23, 2004, the entire contents of which are hereby incorporated by reference.

BACKGROUND OF THE INVENTION (a) Field of the Invention

The present invention relates to a semiconductor device including dummy features for planarizing the surface of a semiconductor substrate having an isolation film for insulation and isolation between a plurality of elements and a method for manufacturing the same.

(b) Description of Related Art

With the increase in density, functionality and operation speed of semiconductor integrated circuit devices in recent years, an isolation technique such as a trench isolation (STI: shallow trench isolation) technique is becoming mainstream in place of LOCOS (local oxidation of silicon) isolation technique. If the trench isolation technique is used for isolation between elements, the distance between the elements can be made smaller than that between the elements made by the conventional LOCOS technique. However, due to variation in pattern density, surface undulation called dishing occurs in a planarization process that is required to apply the trench isolation technique. For the purpose of correcting the dishing that degrades flatness of a planarized surface, for example, Japanese Unexamined Patent Publication No. HEI 9-107028 proposes a technique for forming so-called dummy features which do not function as active regions in substrate regions where the pattern density is relatively low.

However, as the distance between the elements becomes smaller with the progress in miniaturization of the semiconductor integrated circuit devices, the semiconductor substrate is warped or stressed depending on the distance between the elements or the feature densities of the dummy patterns. The warp or stress thus caused may bring about a problem of variation in operation characteristics of the elements. If the elements are field-effect transistors, the variation in operation characteristics signifies variation in threshold voltage, variation in drain current or increase in leakage current. In this specification, an influence of the substrate stress on the operation characteristics is called a stress effect.

SUMMARY OF THE INVENTION

In view of the above problems of known techniques, a first object of the present invention is to reduce the stress effect of an isolation region on the element formation regions (active regions) by means of dummy features formed for the planarization of a semiconductor surface provided with the isolation region. Further, a second object of the invention is to improve the operation characteristics of the elements by positively controlling (adjusting) the stress effect.

As a result of various studies, the inventors of the present invention have gained first findings that, on a semiconductor substrate including the element formation regions serving as the active regions (may be referred to as OD: oxide definition) and the dummy features serving as dummy regions, the stress caused on the active regions decreases with a decrease in width of the isolation regions (STI width) made of, for example, an insulating oxide film surrounding the active regions.

The inventors have also gained second findings that the stress effect is relieved by forming an extended region of a predetermined width around the circuit formation region including a plurality of element formation regions. In this context, the extended region around the circuit formation region is referred to as a stress effect relief region.

Further, the inventors have also gained third findings that the stress caused on the active regions by the isolation regions has a dependence on both the width of the active regions (OD width) and the STI width. According to the third findings, the elements can be given with desired characteristics by not only specifying the STI width as the minimum allowable value in respect of the manufacture but also applying the stress positively to the active regions.

The first invention has been achieved based on the first and second findings and the second invention has been achieved based on the second and third findings.

More specifically, in order to achieve the first object, a first semiconductor device according to the present invention comprises: a circuit formation region which is formed in a semiconductor substrate and includes a plurality of element formation regions surrounded by isolation regions, respectively; a stress effect relief region of a predetermined width formed around the circuit formation region to relieve a stress effect of the isolation regions on the operation characteristics of elements formed in the element formation regions; and a plurality of dummy features formed at predetermined distances in the stress effect relief region and other part of the circuit formation region than the element formation regions, the said dummy features having the same composition as the element formation regions and predetermined planar dimensions; wherein the predetermined planar dimensions of the dummy features are defined by longitudinal and transverse dimensions most frequently found in the plurality of element formation regions or selected dimensions of the element formation regions; and the predetermined distances between the dummy features are specified as the minimum allowable value in respect of the manufacture of the elements.

According to the first semiconductor device, the stress effect relief region of the predetermined width is formed around the circuit formation region, which relieves the stress caused by the isolation regions on the elements formed in the element formation regions close to the edge of the circuit formation region. Further, since the plurality of dummy features are formed at predetermined distances in the stress effect relief region and other part of the circuit formation region than the element formation regions and the dummy features have the same composition as the element formation regions and the predetermined planar dimensions, undulation on the surface such as dishing does not occur even in the planarization step following the formation of the isolation regions. Moreover, since the predetermined planar dimensions of each of the dummy features are defined by longitudinal and transverse dimensions most frequently found in the element formation regions or selected dimensions of the element formation regions, variations in operation characteristics of the elements formed in the circuit formation region are reduced. Further, the predetermined distances between the dummy features, i.e., the widths of the isolation regions, are specified as the minimum allowable value in respect of the manufacture of the elements. Therefore, based on the first findings, the stress caused on each of the active regions by the isolation regions is reduced, which allows reduction of the stress effect on the whole surface of the circuit formation region.

Further, in order to achieve the second object, a second semiconductor device according to the present invention comprises: a circuit formation region which is formed in a semiconductor substrate and includes a plurality of element formation regions surrounded by isolation regions, respectively; a stress effect control region of a predetermined width formed around the circuit formation region to control a stress effect of the isolation regions on the operation characteristics of elements formed in the element formation regions; and a plurality of dummy features formed at predetermined distances in the stress effect control region and other part of the circuit formation region than the element formation regions, the said dummy features having the same composition as the element formation regions and predetermined planar dimensions; wherein the predetermined planar dimensions of the dummy features are defined by longitudinal and transverse dimensions most frequently found in the plurality of element formation regions or selected dimensions of the element formation regions; and the predetermined distances between the dummy features are specified as such longitudinal and transverse dimensions that certain stresses are caused by the isolation regions to the circuit formation region in the longitudinal direction and the transverse direction, respectively, based on the dependence of the stress from the isolation regions to the dummy features on the width of the isolation regions.

According to the second semiconductor device, the stress effect control region of the predetermined width is formed around the circuit formation region, which controls the stress caused by the isolation regions on the elements formed in the element formation regions close to the edge of the circuit formation region. Further, since the plurality of dummy features are formed at predetermined distances in the stress effect control region and other part of the circuit formation region than the element formation regions and the dummy features have the same composition as the element formation regions and predetermined planar dimensions, undulation on the surface such as dishing does not occur even in the planarization step following the formation of the isolation regions. Moreover, since the predetermined planar dimensions of the dummy features are defined by longitudinal and transverse dimensions most frequently found in the element formation regions or selected dimensions of the element formation regions, variations in operation characteristics of the elements formed in the circuit formation region are reduced. Further, the predetermined distances between the dummy features are specified as such longitudinal and transverse dimensions that certain stresses are caused by the isolation regions on the circuit formation region in the longitudinal direction and the transverse direction, respectively, based on the dependence of the stress from the isolation regions to the dummy features on the width of the isolation regions. Therefore, based on the third findings, the stress caused on the active regions by the isolation regions becomes uniform, which allows control of the stress effect on the whole surface of the circuit formation region. Thus, the elements formed in the element formation regions in the circuit formation region are given with desired operation characteristics.

In the second semiconductor device, the dependence on the isolation region width is the third findings, which preferably signifies a relationship in which the stress from the isolation region to the dummy feature decreases with an increase in planar dimensions of the dummy feature (and the element formation region) when the width of the isolation region is fixed, and the stress from the isolation region to the dummy feature decreases with a decrease in width of the isolation region when the width of the dummy feature is fixed.

Further, in the second semiconductor device, the dependence on the isolation region width is preferably a relationship derived from the third findings, in which the stress caused by the isolation region of a predetermined width on the dummy feature of the predetermined planar dimensions surrounded by the isolation region of the predetermined width is standardized as 1 and a value obtained by multiplying the standardized stress by the ratio of the width of the dummy feature to the sum of the widths of the isolation region and the dummy feature decreases linearly with an increase in width of the dummy feature. In so doing, one of the width of the dummy features (element formation regions) and the width of the isolation regions is determined uniquely when the other is specified. Therefore, desired stresses are applied from the isolation regions to the element formation regions in the longitudinal and transverse directions, respectively.

In the first semiconductor device, the predetermined width of the stress effect relief region is preferably not less than 2 µm.

In the second semiconductor device, the predetermined width of the stress effect control region is preferably not less than 2 µm.

Based on the second findings, the inventors of the present invention have confirmed that the width of the stress effect relief region or the stress effect control region formed around the circuit formation region including the plurality of element formation regions should be specified as not less than 2 µm, if the semiconductor substrate is made of silicon.

A first method for manufacturing a semiconductor device according to the present invention comprises the steps of: (a) forming a circuit formation region including a plurality of element formation regions surrounded by isolation regions, respectively, in a main surface of a semiconductor substrate; (b) forming a stress effect control region of a predetermined width around the circuit formation region in the main surface of the semiconductor substrate to control a stress effect of the isolation regions on the operation characteristics of elements formed in the element formation regions; and (c) forming a plurality of dummy features in the stress effect control region and other part of the circuit formation region than the element formation regions at predetermined distances, the dummy features having the same composition as the element formation regions and predetermined planar dimensions; wherein the step (c) comprises the steps of: determining the predetermined planar dimensions of the dummy features as the longitudinal and transverse dimensions most frequently found in the plurality of element formation regions formed in the circuit formation region or defining the predetermined planar dimensions of the dummy features as selected dimensions of the element formation regions; obtaining the dependence of the stress from the isolation regions to the dummy features on the width of the isolation regions; and specifying the predetermined distances between the dummy features as such longitudinal and transverse dimensions that certain stresses are caused by the isolation regions on the circuit formation region in the longitudinal direction and the transverse direction, respectively, based on the dependence on the width of the isolation regions.

According to the first method for manufacturing the semiconductor device, the stress effect relief region of the predetermined width is formed around the circuit formation region in the main surface of the semiconductor substrate, which relieves the stress of the isolation regions on the elements formed in the element formation regions close to the edge of the circuit formation region. Further, since the plurality of dummy features are formed in the stress effect relief region and the circuit formation region at predetermined distances and the dummy features have the same composition as the element formation regions, undulation on the surface such as dishing does not occur even in the planarization step following the formation of the isolation regions. Moreover, since the predetermined planar dimensions of the dummy features are defined by longitudinal and transverse dimensions most frequently found in the element formation regions or selected dimensions of the element formation regions, variations in operation characteristics of the elements formed in the circuit formation region are reduced. Further, the predetermined distances between the dummy features are specified as the minimum allowable values in respect of the manufacture of the elements. Therefore, based on the first findings, the stress caused on each of the active regions by the isolation regions is reduced, which allows reduction of the stress effect on the whole surface of the circuit formation region.

A second method for manufacturing a semiconductor device according to the present invention comprises the steps of: (a) forming a circuit formation region including a plurality of element formation regions surrounded by isolation regions, respectively, in a main surface of a semiconductor substrate; (b) forming a stress effect control region of a predetermined width around the circuit formation region in the main surface of the semiconductor substrate to control a stress effect of the isolation regions on the operation characteristics of elements formed in the element formation regions; and (c) forming a plurality of dummy features in the stress effect control region and other part of the circuit formation region than the element formation regions at predetermined distances, the dummy features having the same composition as the element formation regions and predetermined planar dimensions; wherein the step (c) comprises the steps of: determining the predetermined planar dimensions of the dummy features as the longitudinal and transverse dimensions most frequently found in the plurality of element formation regions formed in the circuit formation region or defining the predetermined planar dimensions of the dummy features as selected dimensions of the element formation regions; obtaining the dependence of the stress from the isolation regions to the dummy features on the width of the isolation regions; and specifying the predetermined distances between the dummy features as such longitudinal and transverse dimensions that certain stresses are caused by the isolation regions on the circuit formation region in the longitudinal direction and the transverse direction, respectively, based on the dependence on the width of the isolation regions.

According to the second method for manufacturing the semiconductor device, the stress effect control region of the predetermined width is formed around the circuit formation region in the main surface of the semiconductor substrate, which controls the stress caused by the isolation regions on the elements formed in the element formation regions close to the edge of the circuit formation region. Further, since the plurality of dummy features are formed in the stress effect control region and the circuit formation region at predetermined distances and the dummy features have the same composition as the element formation regions, undulation on the surface such as dishing does not occur even in the planarization step following the formation of the isolation regions. Moreover, since the predetermined planar dimensions of the dummy features are defined by longitudinal and transverse dimensions most frequently found in the element formation regions or selected dimensions of the element formation regions, variations in operation characteristics of the elements formed in the circuit formation region are reduced. Further, the predetermined distances between the dummy features are specified as such longitudinal and transverse dimensions that certain stresses are caused by the isolation regions to the circuit formation region in the longitudinal direction and the transverse direction, respectively, based on the dependence on the width of the isolation regions of the stress on the dummy features caused by the isolation regions. Therefore, based on the first findings, the stress caused on each of the active regions by the isolation regions becomes uniform, which allows control of the stress effect on the whole surface of the circuit formation region.

In the second method for manufacturing the semiconductor device, the dependence on the isolation region width preferably signifies a relationship in which the stress caused on the dummy feature by the isolation region decreases with an increase in planar dimensions of the dummy feature when the width of the isolation region is fixed, and the stress caused on the dummy feature by the isolation region decreases with a decrease in width of the isolation region when the width of the dummy feature is fixed.

Further, in the second method for manufacturing the semiconductor device, the dependence on the isolation region width preferably signifies a relationship in which the stress caused by the isolation region of a predetermined width on the dummy feature of the predetermined planar dimensions surrounded by the isolation region of the predetermined width is standardized as 1 and a value obtained by multiplying the standardized stress by the ratio of the width of the dummy feature to the sum of the widths of the isolation region and the dummy feature decreases linearly with an increase in width of the dummy feature.

In the step (b) of the first method for manufacturing the semiconductor device, the predetermined width of the stress effect relief region is preferably not less than 2 µm.

In the step (b) of the second method for manufacturing the semiconductor device, the predetermined width of the stress effect control region is preferably not less than 2 µm.

DETAILED DESCRIPTION OF THE INVENTION

First Embodiment

With reference to the drawings, an explanation is given of a semiconductor device according to a first embodiment of the present invention and a manufacturing method thereof.

First, verification results of the above-described first and second findings are explained.

Figure 1:
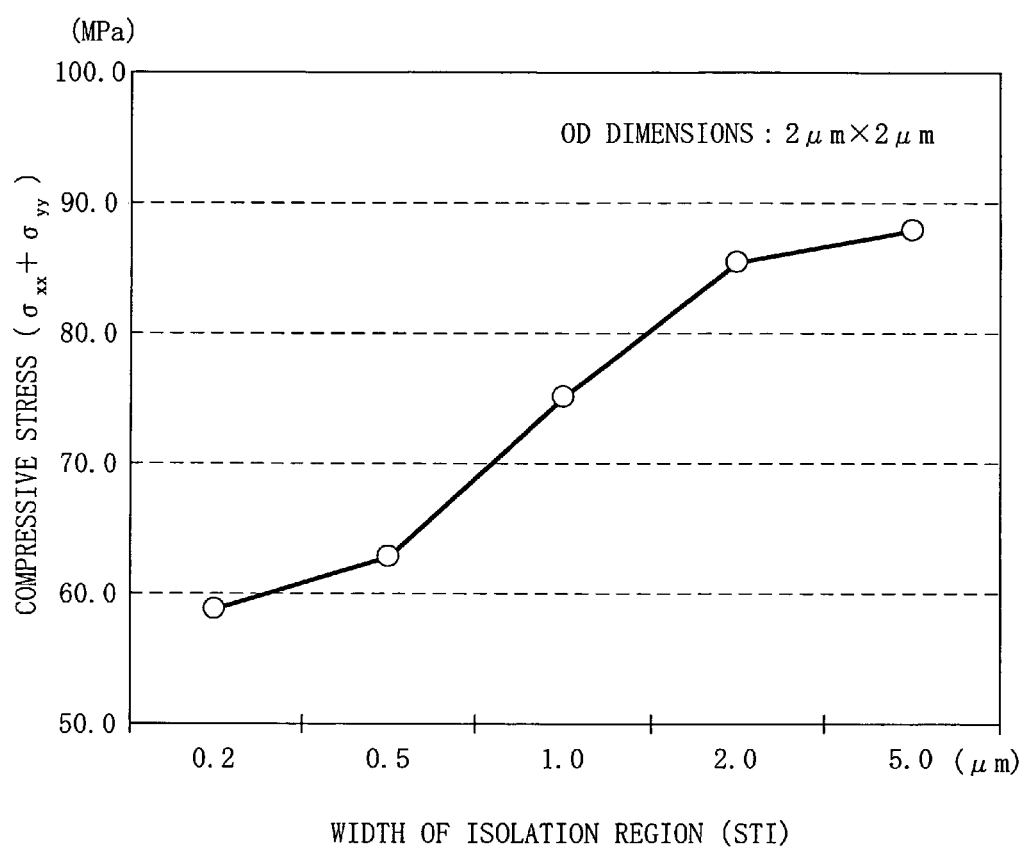
FIG. 1 is a graph illustrating the first findings of the present invention, i.e., the dependence of a compressive stress to an active region formed in a silicon substrate from an isolation region surrounding the active region on the width of the isolation region.

FIG. 1 represents the first findings, illustrating the dependence of a compressive stress to active regions (element formation regions) formed in a semiconductor substrate made of silicon (Si) from isolation regions (STI) made of silicon oxide ($SiO_2$) surrounding the active regions on the width of the isolation regions. Here, the planar shape of a single active region (OD) is 2 µm square and the measurement is carried out by microscopic Raman spectroscopy. As shown in FIG. 1, it is understood that the compressive stress caused on the active regions decreases with a decrease in isolation region width.

Figure 2:
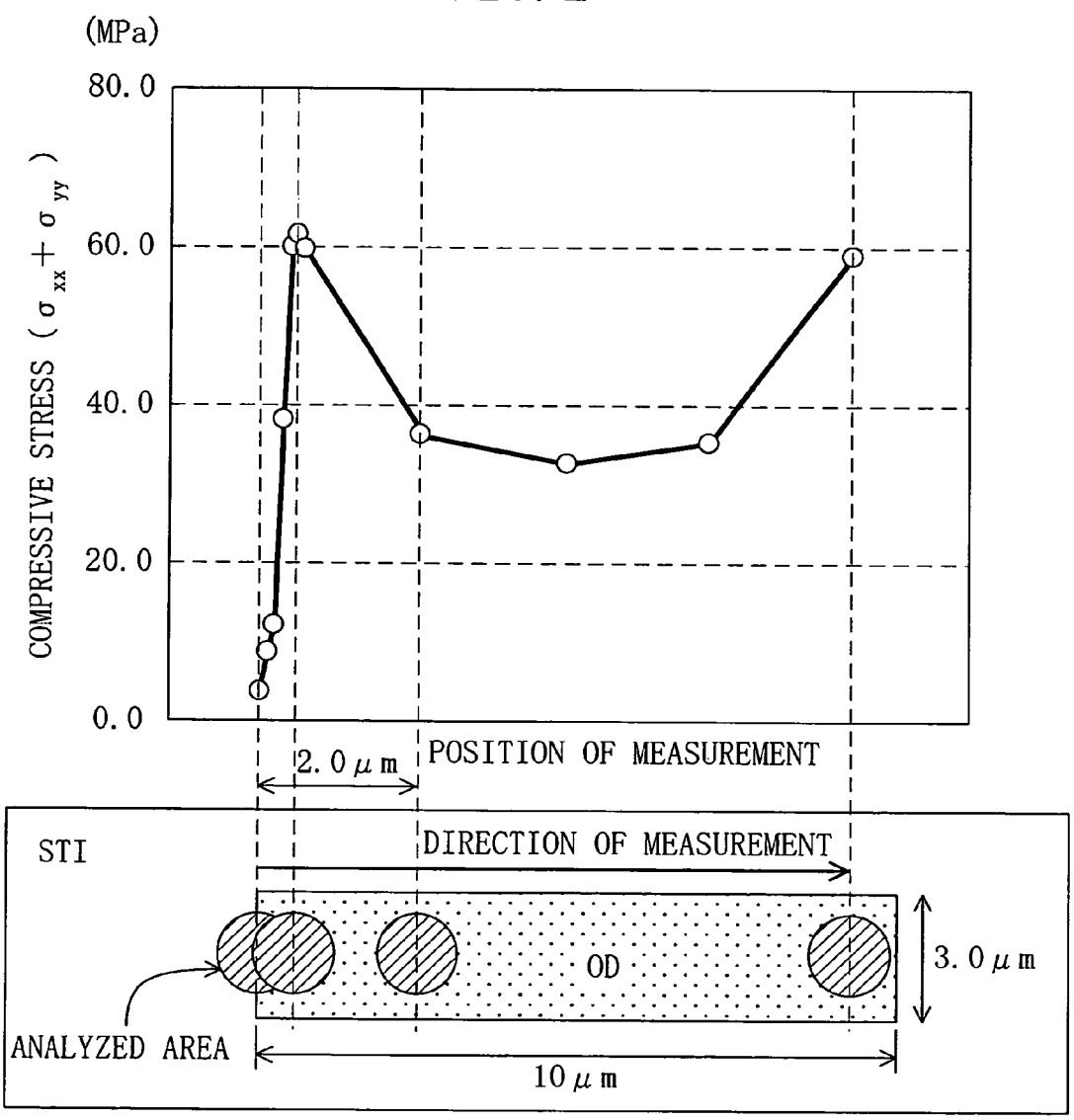
FIG. 2 is a graph illustrating the first findings of the present invention, i.e., the dependence of a compressive stress to the active region formed in the silicon substrate from the isolation region surrounding the active region on the position of the isolation region.

FIG. 2 represents the second findings, illustrating the dependence of a compressive stress to the active regions (element formation regions) formed in the silicon semiconductor substrate from the isolation regions (STI) made of silicon oxide surrounding the active regions on the position of the isolation regions. Here, the planar shape of a single active region (OD) is rectangular of 10 µm long side and 3 µm short side and the measurement was carried out from one of the opposing short sides of the rectangle to the other along the center line parallel to the long side. FIG. 2 indicates that part of the active region within about 2 µm from the edge of the isolation region is affected by the isolation region.

Hereinafter, an explanation is given of a method for manufacturing a semiconductor device of the first embodiment based on the first and second findings, i.e., the steps of arranging the dummy features serving as dummy regions in the circuit formation region.

Figure 3:
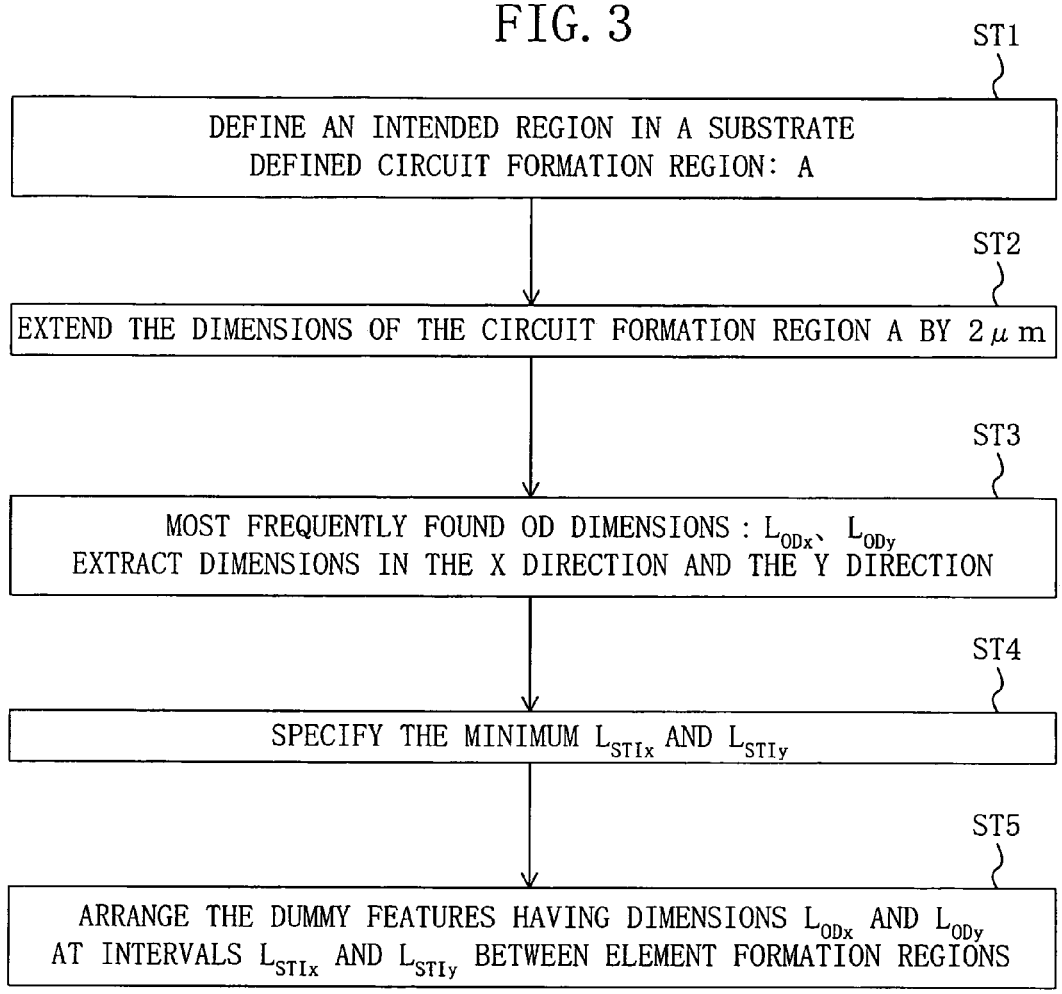
FIG. 3 is a flowchart illustrating the steps of arranging dummy features in a method for manufacturing a semiconductor device according to a first embodiment of the present invention.
Figure 4:
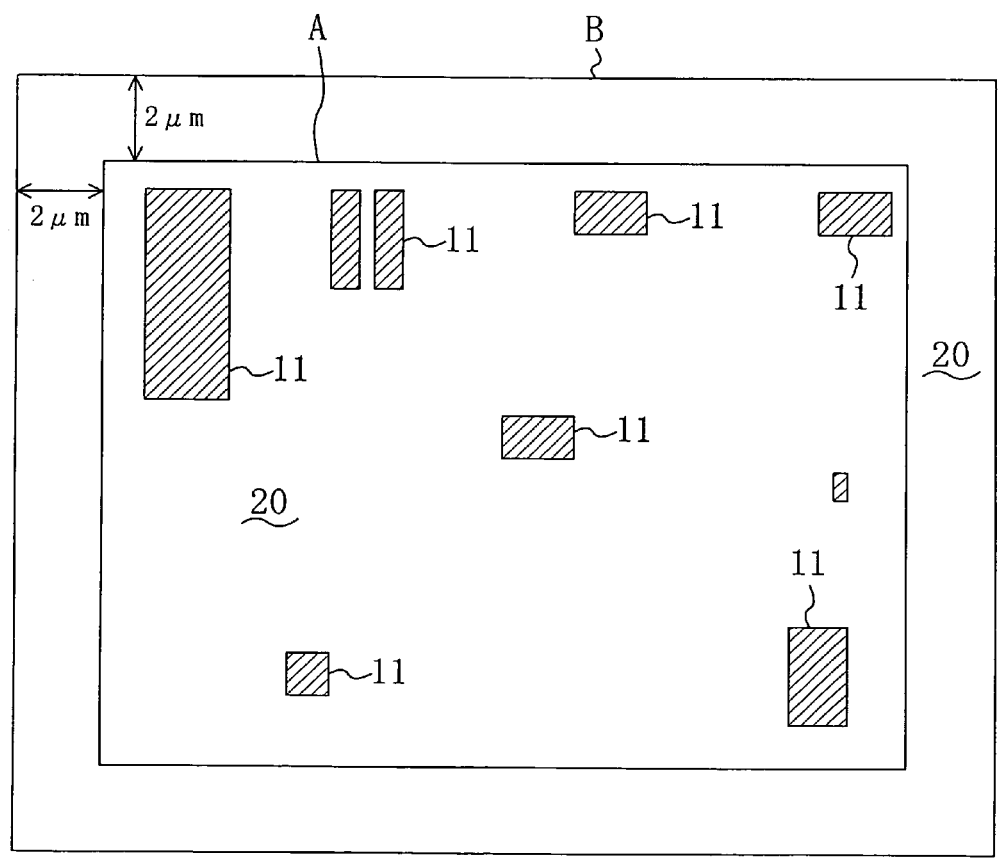
FIG. 4 is a plan view illustrating a circuit formation region and a stress effect relief region before arranging the dummy features in the method for manufacturing the semiconductor device according to the first embodiment of the present invention.

FIG. 3 is a flowchart illustrating the steps of arranging the dummy features according to the first embodiment of the present invention and FIG. 4 shows a planar configuration of a circuit formation region A in which a plurality of active regions (element formation regions) 11 and dummy features for the active regions 11 are formed.

First, as shown in FIG. 3, in the first step ST1, a region in which the circuit formation region is to be arranged is defined. In this embodiment, as shown in FIG. 4, defined is a circuit formation region A including a plurality of active regions 11 (element formation regions) of different planar dimensions each surrounded by an isolation region (STI) 20. The dummy features are so arranged that the stress effect caused on the active regions 11 formed in the thus specified circuit formation region A is reduced.

Then, in the second step ST2 of FIG. 3, the planar dimensions of the circuit formation region A are extended by 2 µm, for example, in the longitudinal and traverse directions based on the second findings to form a stress effect relief region B as shown in FIG. 4. In this way, the influence of the stress caused on the circuit formation region A by the surrounding isolation region 20 is surely reduced by extending the longitudinal and transverse dimensions of the circuit formation region A by at least 2 µm. As shown in FIG. 2, if the width of the stress effect relief region B is less than 2 µm, the influence of the substrate stress on the edge of the circuit formation region A caused by the surrounding region cannot be negligible. Therefore, the effect of the present invention of reducing the stress effect is not so greatly exerted. In this embodiment, the longitudinal and transverse widths of the stress effect relief region B are set equal, but the widths may be varied.

Then, in the third step ST3 of FIG. 3, the planar dimensions of the active regions 11 formed in the circuit formation region A and the frequency thereof in the X direction and the Y direction are obtained. In the first embodiment, a mode $L_{ODx}$ of the lengths of the active regions 11 in the X direction and a mode $L_{ODy}$ of the lengths of the active regions 11 in the Y direction are extracted for the purpose of uniformly reducing the stress effect on every element formed in the circuit formation region A. In order to reduce the stress effect on a certain element formed in the active region 11 of certain planar dimensions, the lengths in the X and Y directions of the active region 11 having the certain predetermined planar dimensions are selected. Accordingly, in this case, the stress effect on the element formed in the active region 11 of the predetermined planar dimensions is most relieved.

Then, in the fourth step ST4 of FIG. 3, the distances between the dummy features arranged in the isolation region 20, i.e., the width of the isolation regions between adjacent dummy features arranged in the X direction and the width of the isolation regions between adjacent dummy features arranged in the Y direction (isolation widths), are determined. According to the first findings, if the planar dimensions of the active regions 11 are fixed, the stress caused by the isolation region 20 on the active regions 11 decreases with a decrease in isolation width. Accordingly, in order to reduce the stress effect on the active regions 11 by varying the isolation width, the minimum allowable isolation width in respect of the design rule or manufacture of the semiconductor device is defined as the isolation width $L_{STIx}$ in the X direction and the isolation width $L_{STIy}$ in the Y direction, i.e., the distances between the dummy features. In this embodiment, the X direction width $L_{STIx}$ and the Y direction width $L_{STIy}$ of the isolation region 20 are set equal.

Then, in the fifth step ST5 of FIG. 3, a plurality of dummy features 12 having the planar dimensions defined in the third step ST3, i.e., the X direction length $L_{ODx}$ and the Y direction length $L_{ODy}$, are arranged in the circuit formation region A and the stress effect relief region B at the X direction distance $L_{STIx}$ and the Y direction distance $L_{STIy}$.

Figure 5:
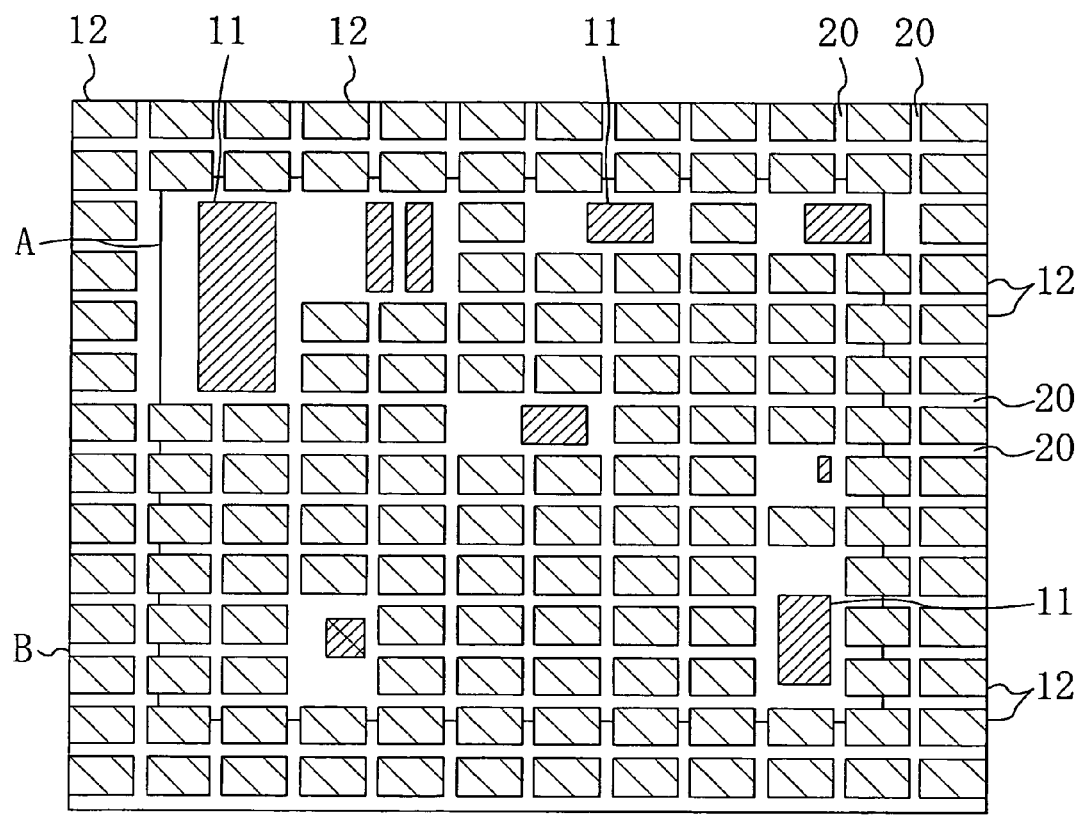
FIG. 5 is a plan view illustrating the circuit formation region and the stress effect relief region after the dummy features have been arranged in the method for manufacturing the semiconductor device according to the first embodiment of the present invention.
Figure 6:
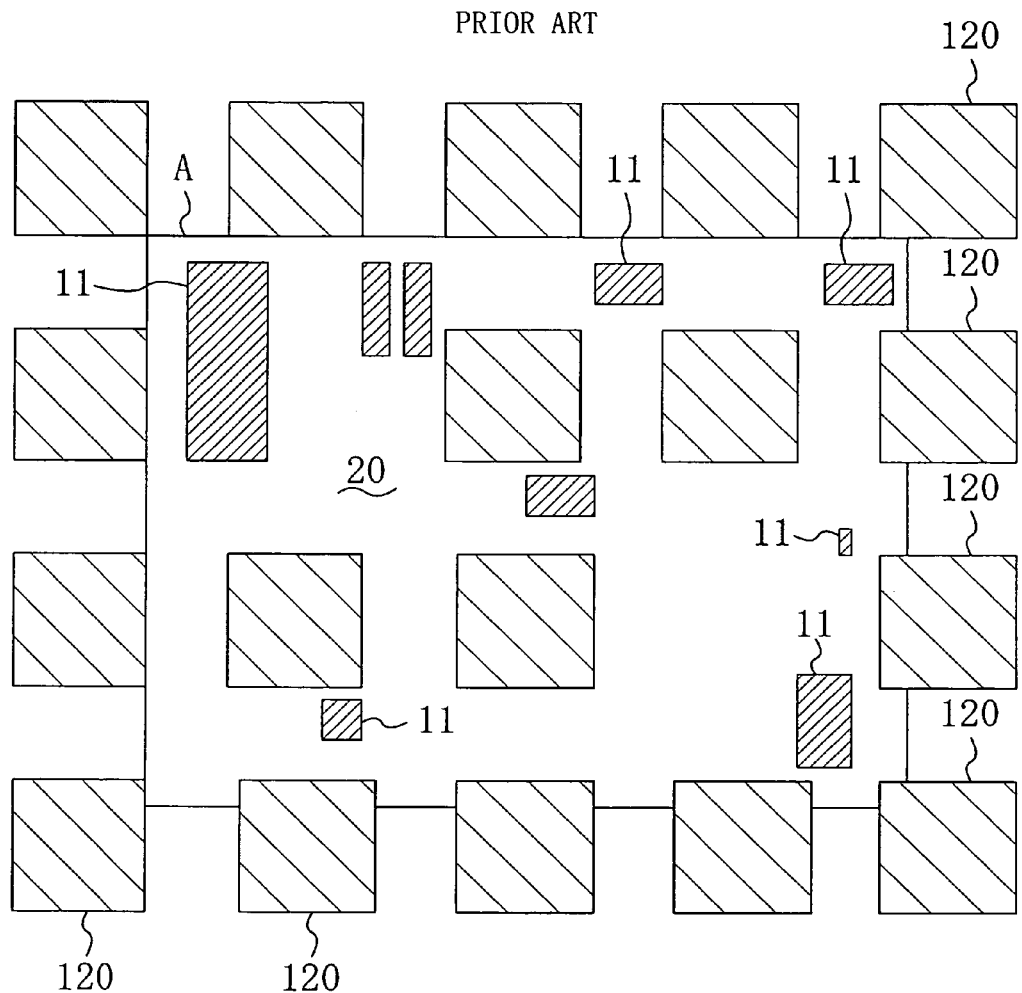
FIG. 6 is a comparative plan view illustrating a circuit formation region in which conventional dummy features have been arranged.

As a comparison, FIG. 6 shows a planar configuration in which a plurality of dummy features 120 are arranged in a conventional circuit formation region A. Referring to FIG. 6, the conventional dummy features 120 and the active regions 11 have large distances and small distances (isolation widths) therebetween, whereas the distances between the dummy features 12 of the present invention and the active regions 11 (isolation widths) are more uniform in the circuit formation region A as shown in FIG. 5.

According to the first embodiment, the stress effect relief region B of 2 μm width or more is formed around the circuit formation region A so as to relieve the stress effect of the isolation region 20 on the operation characteristics of elements formed in the active regions (element formation regions) 11. Further, the plurality of dummy features 12 are formed in the stress effect relief region B and other part of the circuit formation region A than the active regions 11 at certain distances ($L_{STIx}$, $L_{STIy}$) and the dummy features have certain planar dimensions ($L_{ODx}$, $L_{OXy}$) and the same composition as the active regions 11. The planar dimensions ($L_{ODx}$, $L_{OXy}$) of the dummy features 12 are defined by longitudinal and transverse dimensions most frequently found in the plurality of active regions 11 formed in the circuit formation region A or selected dimensions of the element formation regions. Further, the distances between the dummy features 12 ($L_{STIx}$, $L_{STIy}$) are specified as the minimum allowable value in respect of the manufacture of the elements. Therefore, the stress effect on the elements formed in the circuit formation region A is reduced with reliability.

Second Embodiment

Hereinafter, an explanation is given of a semiconductor device according to a second embodiment of the present invention and a method for manufacturing the same with reference to the drawings.

First, verification results of the above-described third findings are explained.

Figure 7:
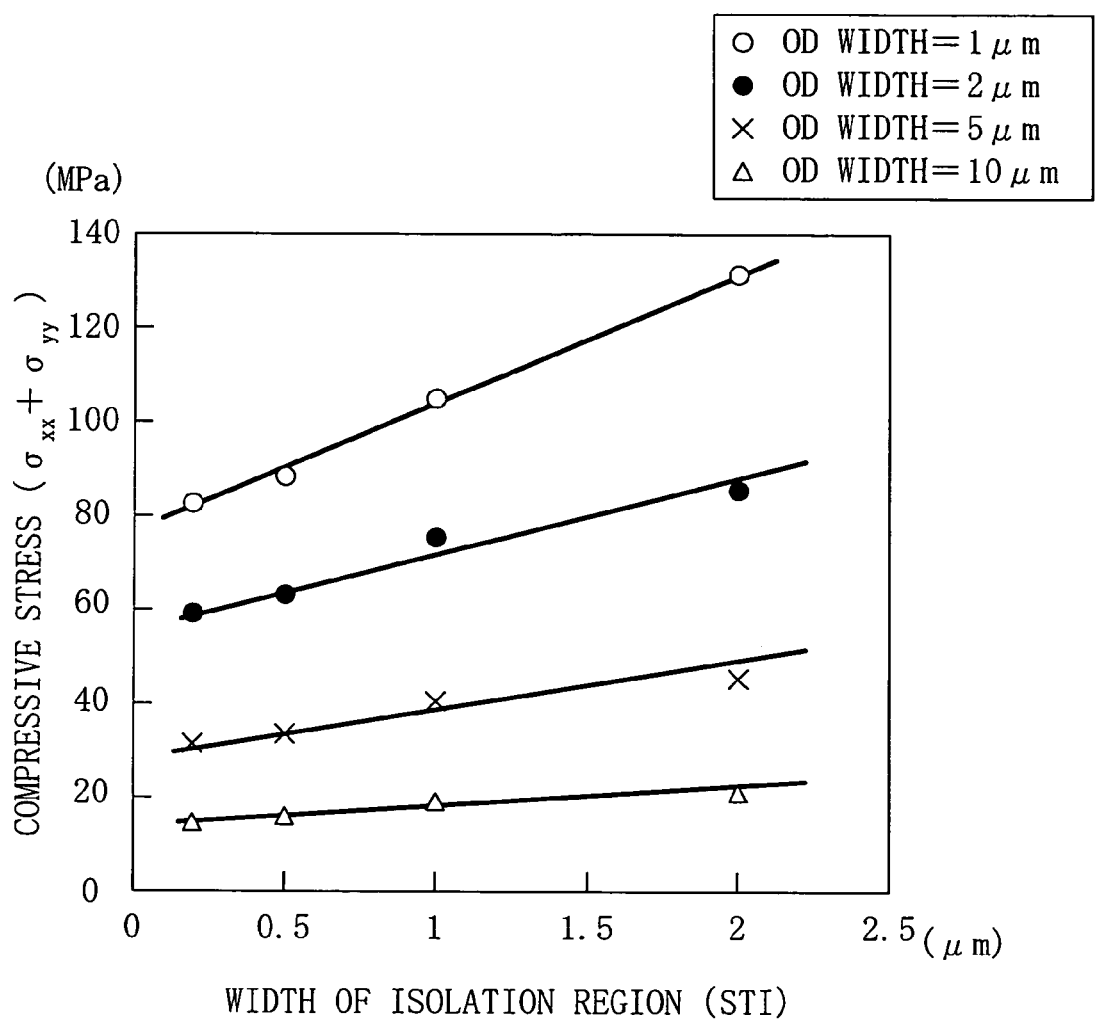
FIG. 7 is a graph illustrating the third findings of the present invention, i.e., the dependence of a compressive stress to the active region formed in the silicon substrate from the isolation region surrounding the active region on the width of the isolation region, with the width of the active regions varied in 4 different values.

FIG. 7 represents the third findings, illustrating the dependence of a compressive stress to active regions (and the dummy features) formed in a semiconductor substrate made of silicon from isolation regions (STI) made of silicon oxide surrounding the active regions on the width of the isolation regions. The active regions (OD) have 4 different widths of 1 μm, 2 μm, 5 μm and 10 μm.

FIG. 7 indicates that if the width of the isolation region is fixed, the stress on the active regions caused by the isolation regions decreases with an increase in planar dimensions of the active regions. Further, if the width of the active regions is fixed, the stress on the active regions caused by the isolation region decreases with a decrease in width of the isolation regions.

Figure 8:
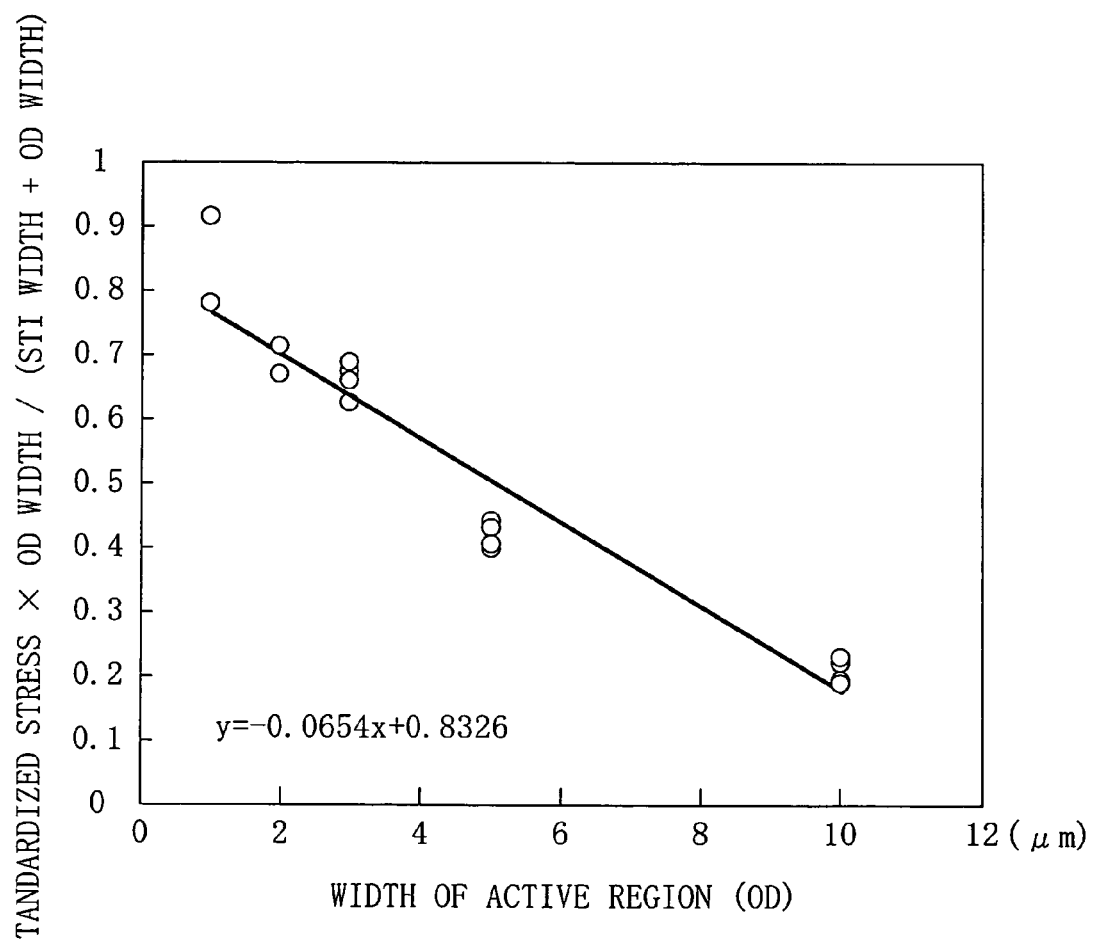
FIG. 8 is a graph illustrating the dependence of a value obtained by multiplying a standardized stress by the ratio of the active region width to the sum of the widths of the isolation region and the active region on the width of the active region.

FIG. 8 is a graph illustrating a relationship derived from the relationship shown in FIG. 7, in which the stress from the isolation region of 1 μm width to the active region (OD) of 2 μm square surrounded by the isolation region is standardized as 1 and a value obtained by multiplying the standardized stress by the ratio of the active region width to the sum of the widths of the isolation region and the active region decreases linearly with an increase in variable, i.e., the active region width.

Here, the active region width is regarded as a variable x and the value obtained by multiplying the standardized stress by the ratio of the active region width to the sum of the widths of the active region and the isolation region is regarded as y. Then, the following approximate expression (1) is obtained by the method of least squares.

$$y = -0.0654x + 0.8326 \quad (1)$$

If the active region width x in the approximate expression is defined, the standardized stress y is determined by calculation. Further, if the standardized stress y is defined, an appropriate active region width x is determined by calculation.

Hereinafter, an explanation is given of a method for manufacturing a semiconductor device of the second embodiment based on the second and third findings, i.e., the steps of arranging the dummy features serving as dummy regions in the circuit formation region.

Figure 9:
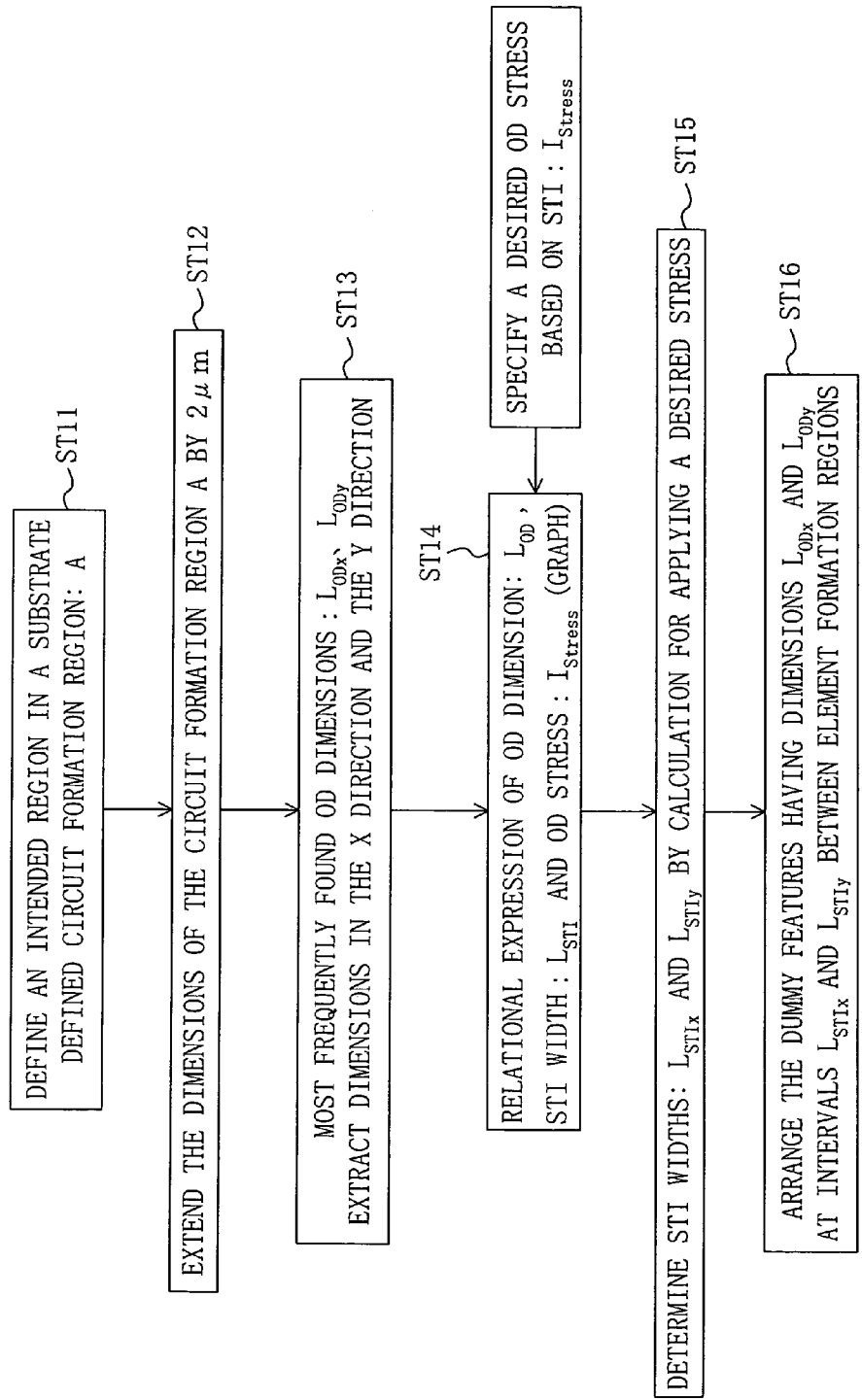
FIG. 9 is a flowchart illustrating the steps of arranging the dummy features in a method for manufacturing a semiconductor device according to a second embodiment of the present invention.
Figure 10:
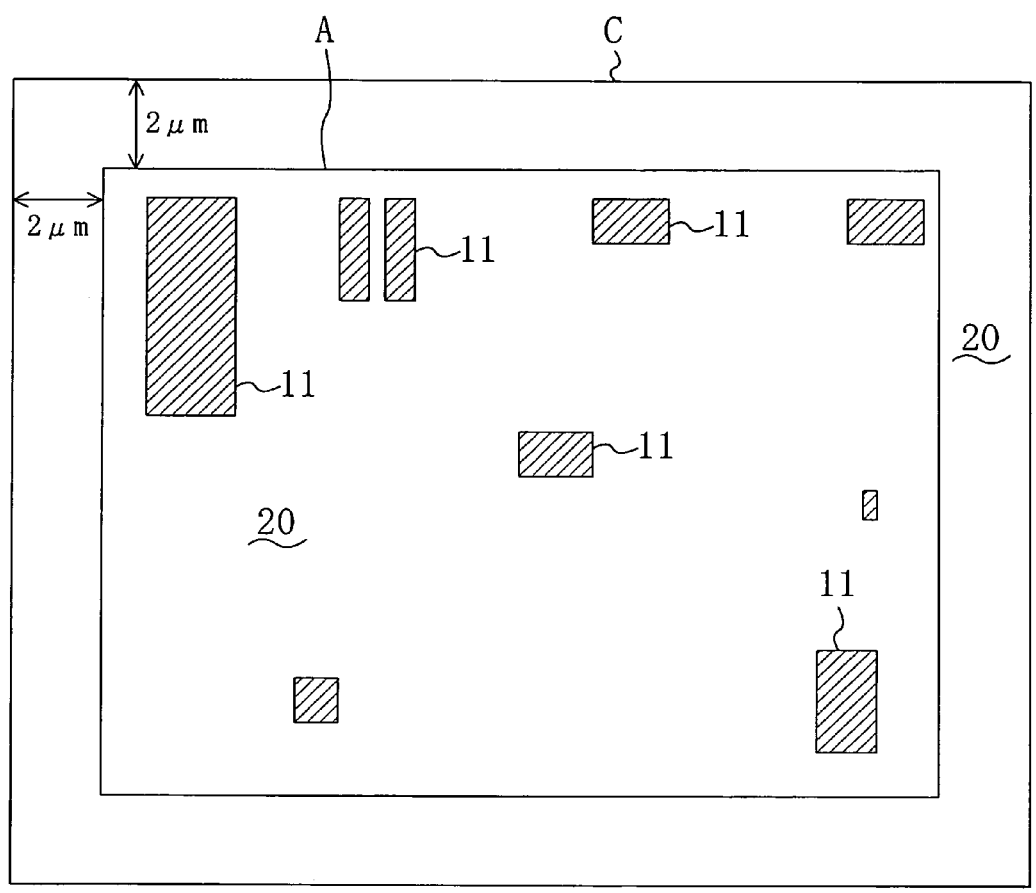
FIG. 10 is a plan view illustrating a circuit formation region and a stress effect control region before arranging the dummy features in the method for manufacturing the semiconductor device according to the second embodiment of the present invention.

FIG. 9 is a flowchart of the steps of arranging the dummy features according to the second embodiment of the present invention and FIG. 10 shows a planar configuration of the circuit formation region A in which a plurality of active regions (element formation regions) 11 and the dummy features serving as dummy regions are formed.

First, as shown in FIG. 9, in the first step ST11, a region in which the circuit formation region is to be arranged is defined. Here, as shown in FIG. 10, is defined a circuit formation region A including a plurality of active regions 11 (element formation regions) of different planar dimensions each surrounded by an isolation region 20. The dummy features are so arranged that the stress effect caused on the active regions 11 formed in the thus specified circuit formation region A is reduced.

Then, in the second step ST12 of FIG. 9, the planar dimensions of the circuit formation region A are extended by 2 μm, for example, in the longitudinal and transverse directions based on the second findings to form a stress effect control region C as shown in FIG. 10. In this way, the influence of the stress caused on the circuit formation region A by the surrounding isolation region 20 is surely reduced by extending the longitudinal and transverse dimensions of the circuit formation region A by at least 2 μm. As shown in FIG. 2, if the width of the stress effect control region C is less than 2 μm, the substrate stress on the edge of the circuit formation region A caused by the surrounding region cannot be controlled sufficiently. In this embodiment, the longitudinal and transverse widths of the stress effect control region C are set equal, but the widths may be varied.

Then, in the third step ST13 of FIG. 9, the planar dimensions of the active regions 11 formed on the circuit formation region A and the frequency thereof in the X direction and the Y direction are obtained. In the second embodiment, a mode $L_{ODx}$ of the X direction lengths of the active regions 11 and a mode $L_{ODy}$ of the Y direction lengths of the active regions 11 are extracted for the purpose of uniformly controlling the stress effect on every element formed on the circuit formation region A. In order to selectively control the stress effect on a certain element in the circuit formation region A, the lengths in the X and Y directions of the active region 11 forming the element are selected. Accordingly, in this case, the stress effect is most controlled to the element formed in the active region 11 of the selected planar dimensions.

Then, in the fourth step ST14 and the fifth step ST15 of FIG. 9, the distances between the dummy features arranged on the isolation region 20, i.e., the width of the isolation regions between the dummy features adjacent in the X direction and the width of the isolation regions between the dummy features adjacent in the Y direction (isolation widths), are determined. According to the third findings, the dimensions of the dummy features and the isolation widths are obtained from a desired standardized stress by using the above-described approximate expression (1), thereby applying a desired stress to the circuit formation region A. That is, a desired stress value ($I_{Stress}$) which is applied to the active region 11 by the isolation region 20 is determined in advance. Then, based on the thus determined desired stress value, the width $L_{STIx}$ of the isolation region 20 between the dummy features arranged in the X direction and the width $L_{STIy}$ of the isolation region 20 between the dummy features arranged in the Y direction are determined by calculation as the distances between the dummy features.

Figure 11:
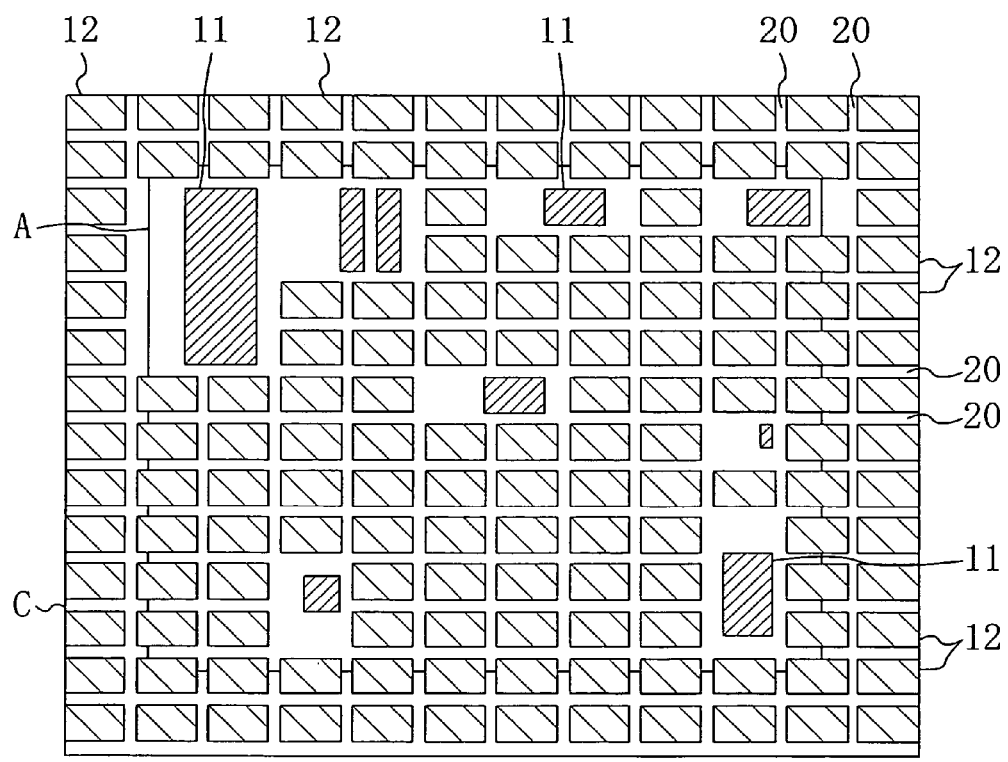
FIG. 11 is a plan view illustrating the circuit formation region and the stress effect control region after the dummy features have been arranged in the method of manufacturing the semiconductor device according to the second embodiment of the present invention.

Then, in the sixth step ST16 of FIG. 9, the plurality of dummy features 12 having the planar dimensions defined in the third step ST13, i.e., the X direction length $L_{ODx}$ and the Y direction length $L_{ODy}$, are arranged in the circuit formation region A and the stress effect control region C at the X direction distance $L_{STIx}$ and the Y direction distance $L_{STIy}$ as shown in FIG. 11.

Thus, according to the second embodiment, the stress effect control region C of 2 μm width or more is formed around the circuit formation region A to allow control of the stress effect of the isolation regions 20 on the operation characteristics of the elements formed in the active regions (element formation regions) 11. Further, the plurality of dummy features 12 are formed in the stress control region C and other part of the circuit formation region A than the active regions 11 at certain distances ($L_{STIx}$, $L_{STIy}$) and the dummy patterns have certain planar dimensions ($L_{ODx}$, $L_{OXy}$) and the same composition as the active regions 11. The planar dimensions ($L_{ODx}$, $L_{OXy}$) of the dummy features 12 are defined by longitudinal and transverse dimensions most frequently found in the plurality of active regions 11 formed in the circuit formation region A or selected dimensions of the element formation regions. Further, the distances between the dummy features 12 ($L_{STIx}$, $L_{STIy}$) are so specified that a desired stress ($I_{Stress}$) is applied from the isolation regions 20 to the active region 11. Therefore, the stress effect on the elements formed in the circuit formation region A is controlled.

If the elements are field-effect transistors, the control of the stress effect signifies control of change in threshold voltage caused by the stress effect, control of change in drain current caused by the stress effect or prevention of current leakage caused by the stress effect.

As described above, the semiconductor device and the method for manufacturing the same according to the present invention are effective in that the substrate stress on the circuit formation region including a plurality of element formation regions becomes uniform to reduce the stress effect, thereby preventing variations in operation characteristics of the elements formed in the circuit formation regions and permitting the control of the stress effect. Therefore, the present invention is effectively applied to a semiconductor device including dummy features for planarizing a surface of a semiconductor substrate having an isolation film for insulation and isolation between a plurality of elements and a method for manufacturing the same.

What is claimed is:

1. A method for manufacturing a semiconductor device comprising the steps of:
   (a) forming a circuit formation region including a plurality of element formation regions surrounded by isolation regions, respectively, in a main surface of a semiconductor substrate;
   (b) forming a stress effect control region of a predetermined width around the circuit formation region in the main surface of the semiconductor substrate to control a stress effect of the isolation regions on the operation characteristics of elements formed in the element formation regions; and
   (c) forming a plurality of dummy features in the stress effect control region and other part of the circuit formation region than the element formation regions at predetermined distances, the dummy features having the same composition as the element formation regions and predetermined planar dimensions; wherein
   the step (c) comprises the steps of:
   determining the predetermined planar dimensions of the dummy features as the longitudinal and transverse dimensions most frequently found in the plurality of element formation regions formed in the circuit formation region or defining the predetermined planar dimensions of the dummy features as selected dimensions of the element formation regions;
   obtaining the dependence of the stress from the isolation regions to the dummy features on the width of the isolation regions; and
   specifying the predetermined distances between the dummy features as such longitudinal and transverse dimensions that certain stresses are caused by the isolation regions to the circuit formation region in the longitudinal direction and the transverse direction, respectively, based on the dependence on the width of the isolation regions, and
   wherein the dependence on the isolation region width is a relationship in which the stress caused on the dummy feature by the isolation region decreases with an increase in planar dimensions of the dummy feature when the width of the isolation region is fixed, and the stress caused on the dummy feature by the isolation region decreases with a decrease in width of the isolation region when the width of the dummy feature is fixed.

2. A method according to claim 1, wherein in step (b) the predetermined width of the stress effect relief region is not less than 2 μm.

3. A method for manufacturing a semiconductor device comprising the steps of:
   (a) forming a circuit formation region including a plurality of element formation regions surrounded by isolation regions, respectively, in a main surface of a semiconductor substrate;
   (b) forming a stress effect control region of a predetermined width around the circuit formation region in the main surface of the semiconductor substrate to control a stress effect of the isolation regions on the operation characteristics of elements formed in the element formation regions; and
   (c) forming a plurality of dummy features in the stress effect control region and other part of the circuit formation region than the element formation regions at predetermined distances, the dummy features having the same composition as the element formation regions and predetermined planar dimensions; wherein the step (c) comprises the steps of:
   determining the predetermined planar dimensions of the dummy features as the longitudinal and transverse dimensions most frequently found in the plurality of element formation regions formed in the circuit formation region or defining the predetermined planar dimensions of the dummy features as selected dimensions of the element formation regions;
   obtaining the dependence of the stress from the isolation regions to the dummy features on the width of the isolation regions; and specifying the predetermined distances between the dummy features as such longitudinal and transverse dimensions that certain stresses are caused by the isolation regions to the circuit formation region in the longitudinal direction and the transverse direction, respectively, based on the dependence on the width of the isolation regions, and wherein the dependence on the isolation region width is a relationship in which the stress caused by the isolation region of a predetermined width on the dummy feature of the predetermined planar dimensions surrounded by the isolation region of the predetermined width is standardized as 1 and a value obtained by multiplying the standardized stress by the ratio of the width of the dummy feature to the sum of the widths of the isolation region and the dummy feature decreases linearly with an increase in width of dummy feature.

4. A method according to claim 3, wherein in step (b) the predetermined width of the stress effect control region is not less than 2 μm.

* * * * *